(12) United States Patent
Wang et al.

(10) Patent No.: US 7,849,745 B2
(45) Date of Patent: Dec. 14, 2010

(54) ULTRA-LOW NOISE MEMS PIEZOELECTRIC ACCELEROMETERS

(75) Inventors: Li-Peng Wang, San Jose, CA (US); Friedel Gerfers, Mountain View, CA (US); Ming-Yuan He, Goleta, CA (US)

(73) Assignee: Intel Corporation, Santa Clara, CA (US)

( * ) Notice: Subject to any disclaimer, the term of this patent is extended or adjusted under 35 U.S.C. 154(b) by 489 days.

(21) Appl. No.: 11/902,943

(22) Filed: Sep. 26, 2007

(65) Prior Publication Data

US 2009/0078044 A1    Mar. 26, 2009

(51) Int. Cl.
G01P 15/09    (2006.01)
(52) U.S. Cl. ............... 73/514.34; 73/514.36; 73/514.38
(58) Field of Classification Search ............. 73/514.34, 73/514.36, 514.38
See application file for complete search history.

(56) References Cited

U.S. PATENT DOCUMENTS 5,209,117 A * 5/1993 Bennett ................... 73/514.16
5,412,986 A * 5/1995 Beringhause et al. ..... 73/514.33

OTHER PUBLICATIONS

U.S. Appl. No. 11/097,059, filed Mar. 31, 2005, Wang et al.
F. Gerfers, et al., "Fabrication and Characterization of Bulk-micromachined Accelerometers Based on AlN Piezoelectric Sensing and SOI Wafers", Proceedings of Eurosensors, Sep. 2006.
L.-P. Wang, et al., "Design, Fabrication, and Measurement of High-Sensitivity Piezoelectric Microelectromechanical Systems Accelerometers," IEEE Micromechanical Systems, vol. 12, No. 4, Aug. 2003.
F. Levinzon, "Fundamental Noise Limit of Piezoelectric Accelerometer", IEEE Sensors Journal, vol. 4, No. 1, Feb. 2004.
Christopher McLean and Dave Wolfe, "Intelligent Wireless" Techkor Instrumentation, Machine Monitoring/Networking, Jun. 2002 http://archives.sensorsmag.com/articles/0602/14/main.shtml.

* cited by examiner

*Primary Examiner*—John E Chapman
(74) *Attorney, Agent, or Firm*—Pearl Cohen Zedek Latzer, LLP (57) ABSTRACT

Sensing structures are provided which are designed using non-conventional designs. These sensing structures have improved sensitivity and noise floor at low frequencies.

13 Claims, 7 Drawing Sheets

STRESS

STRESS CONTOUR OF DEVICE
IV WITHOUT BALANCE BARS

STRESS CONTOUR OF DEVICE
IV WITH BALANCE BARS

*Device parameter summary*

|  | Design IV |
|---|---|
| $f_0$ [kHz] | 1.1 |
| Sensitivity [pC/g] | 5.2 |
| Sensor Capacitance [pF] | 502 |
| Size (Area) [$mm^2$] | 45.8 |
| Proof mass [mgram] | 10.1 |

ULTRA-LOW NOISE MEMS PIEZOELECTRIC ACCELEROMETERS

FIELD OF THE INVENTION

The present invention generally relates to sensing structures. In particular, the present-invention relates to microelectromechanical systems sensing structures.

BACKGROUND OF THE INVENTION

Vibration sensors are used for monitoring structures (e.g., buildings, bridges), vehicles (e.g., ships, airplanes, autos, trains) and machines. In fabrication facilities, many tools, particularly high precision lithographic and analytical tools, require real time monitoring for any abnormal vibration signals. Excess vibrations in the environment may cause malfunction of tools. Vibration signals originating from the tools themselves may serve as an indication that the tools require maintenance. Accurate in-line monitoring could significantly reduce down time and its associated cost. Machine vibration monitoring and diagnostics require a very low noise floor at low frequencies because the amplitude of vibrations, in terms of acceleration that is produced, is very small at low frequencies.

However, state of the art vibration sensors available on the market cannot satisfy all of these applications. Highly sensitive vibration sensors with a noise floor of approximately 1 µg/sqrt(Hz) at approximately 10 Hz are large in size, making them difficult to use in many applications requiring a small form factor and light weight, such as monitoring robotic arms. They are also prohibitively expensive for large-scale sensor network applications that are becoming increasingly important.

Microelectromechanical systems (MEMS) accelerometers based on piezoelectric sensing have been demonstrated to be an attractive alternative to capacitive sensing because of lower power consumption (use of active materials) and potential integration of sensing and actuating elements within one device.

Currently MEMS based sensors of small sizes are not sensitive enough at low frequency ranges. A MEMS sensor covering a reasonable frequency range typically has its resonance frequency greater than 10 KHz. Such a sensor has a noise level of approximately 100 µg/sqrt(Hz) at approximately 10 Hz which is two orders of magnitude too high.

One architecture to achieve the aforementioned requirements of low noise, wide bandwidth, and small size is based on the approach of a Vibration Spectrum Sensor Array (VSSA).

One bulk-micromachined accelerometer uses CMOS compatible piezoelectric Aluminum Nitride (AlN) thin films and silicon-on-insulator (SOI) wafers. However, one such sensor only showed a sensitivity of 0.45 pC/g and noise floor of 3 µg/sqrt(Hz) at 20 Hz. In order to further improve the signal-to-noise ratio in the low frequency region, a new accelerometer design is needed to obtain an optimized performance in terms of sensitivity per area.

BRIEF DESCRIPTION OF THE DRAWINGS

Embodiments of the invention will be understood and appreciated more fully from the following detailed description in conjunction with the drawings in which like reference numerals indicate corresponding, analogous or similar elements, and in which.

DESCRIPTION OF THE PREFERRED EMBODIMENT

In the following description, various aspects of the present invention will be described. For purposes of explanation, specific configurations and details are set forth in order to provide a thorough understanding of the present invention. However, it will be apparent to one skilled in the art that the present invention may be practiced without the specific details presented herein. Furthermore, well-known features may be omitted or simplified in order not to obscure the present invention. Various examples are given throughout this description. These are merely descriptions of specific embodiments of the invention. The scope of the invention is not limited to the examples given.

One embodiment of the present invention includes a sensing structure including for example a frame; a proof mass; and a plurality of arms, each arm including an electrode having two ends, wherein a first of the two ends is attached to said frame and a second of the two ends is attached to said proof mass; and a beam disposed approximately in the center of said electrode, wherein said first end tapers from said beam to said frame and said second end tapers from said beam to said proof mass.

The frame may be for example a quadrilateral. The proof mass may be centrally located within the sensing structure. The arms may be attached to the corners of the frame. The arms may be attached between the corners of the frame. The arms may be attached centrally between the corners of the frame. The beam may forms a ring structure joining the arms. The structure may be formed in a process flow for lead zirconate titanate. The sensing structure may be formed in a process flow for aluminum nitride.

Total noise of a piezoelectric sensor in terms of equivalent acceleration noise is described in EQ. 1, which consists of two noise sources: mechanical-thermal or Brownian noise ($a_{nm}$) and electrical-thermal noise ($a_{ne}$):

$$\frac{a_{nt}^2}{\Delta f} = \frac{a_{nm}^2}{\Delta f} + \frac{a_{ne}^2}{\Delta f} = 4k_B T \frac{\omega_0}{mQ} + 4k_B T \frac{DC_s}{\omega Q_T^2} \qquad \text{EQ. 1}$$

where $k_B$ is Boltzmann's constant, T is the absolute temperature, $\omega_0$ is the resonant frequency, m is the effective sensor mass, Q is the quality factor; $C_s$ is the sensor capacitance, D is the dissipation factor of the piezoelectric material, $\omega$ is the operating frequency, and $Q_T$ is the charge sensitivity.

The noise spectrum is dominated by Brownian noise at high frequencies and by electrical-thermal noise at low frequencies since $a_{ne}$ has a 1/f relation. To minimize $a_{ne}$, the strategy is to increase $Q_T$ and/or reduce $C_s$ and D. However, for a given piezoelectric material and a fixed electrode area, the capacitance and dielectric loss are constrained. Therefore, it has been determined that a better sensing structure may be achieved by increasing the charge sensitivity. The charge sensitivity of the piezoelectric accelerometer based on the bending mode is described in EQ. 2, $$Q_T = \int (d_{31} \times \sigma) \cdot dA \qquad \text{EQ. 2}$$

where $d_{31}$ is the transverse piezoelectric constant, $\sigma$ the stress and dA the electrode area.

Figure 1A:
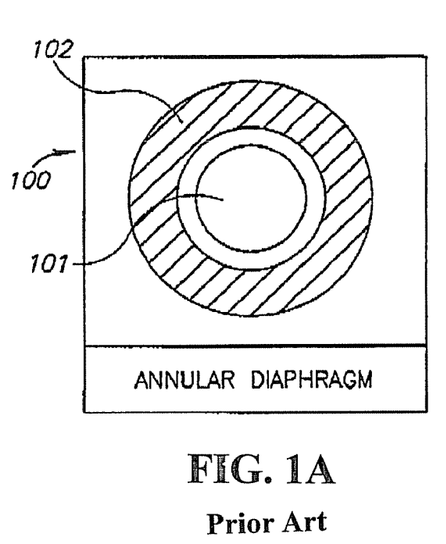
FIGS. 1A and 1B show a sensing structure based on an annular diaphragm design and a sensing structure based on a clamp-clamp beam design, respectively.
Figure 1B:
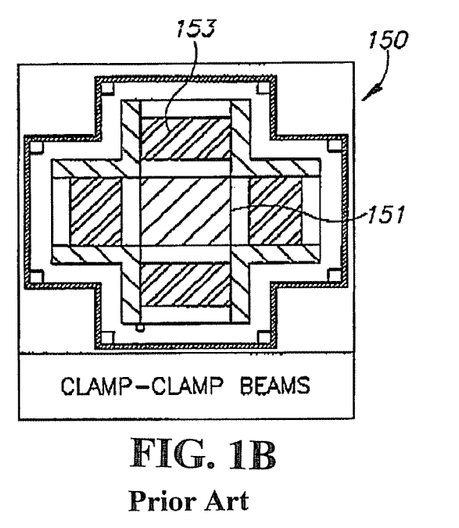
Figure 1C:
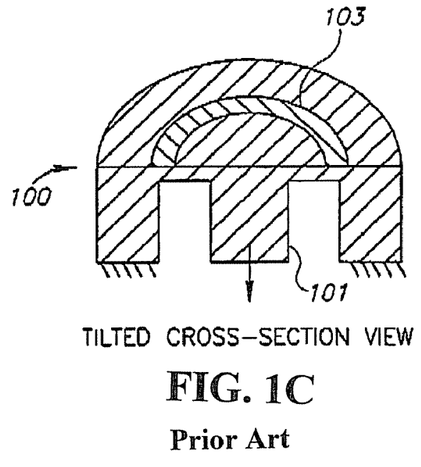
FIGS. 1C and 1D show cross-sectional views of FIGS. 1A and 1B, respectively.
Figure 1D:
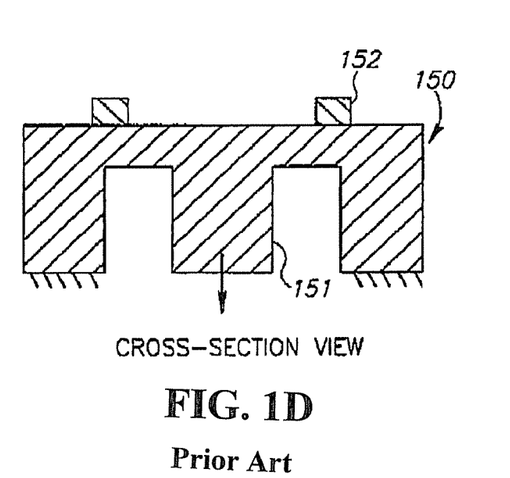

Conventional design of sensing structures is mostly based on simple structures, such as cantilever beams, clamp-clamp beams, and annular diaphragm. FIG. 1A shows an embodiment of a sensing structure 100 based on an annular diaphragm design and FIG. 1B shows an embodiment of a sensing structure 150 based on a clamp-clamp beam design. Sensing structure 100 is also shown in a tilted cross-sectional view in FIG. 1C and sensing structure 150 is also shown in a cross-sectional view in FIG. 1D. Sensing structure 100 has a proof mass 101, a sensing material 102, and a membrane 103. Sensing structure 150 has a proof mass 151, a sensing material 152, and a beam 153. Sensing structures for MEMS piezoelectric accelerometers such as 100 and 150, which are based on conventional sensing structures, cannot be further improved in terms of their sensitivity and size. Therefore, the 1/f noise floor cannot be improved using conventional designs.

Figure 2A:
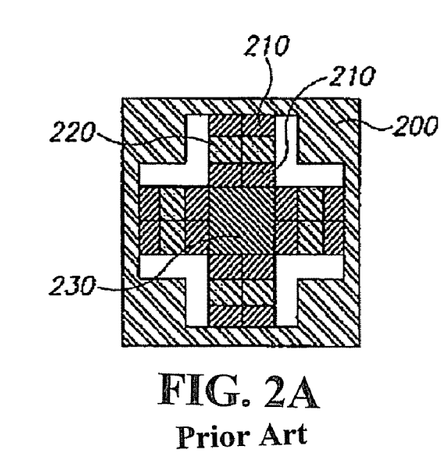
FIGS. 2A-2D show four vibration sensor designs, which have different sensing structures but are designed to have the same resonance frequency and weight of the proof mass for fair comparisons, according to one embodiment.
Figure 2B:
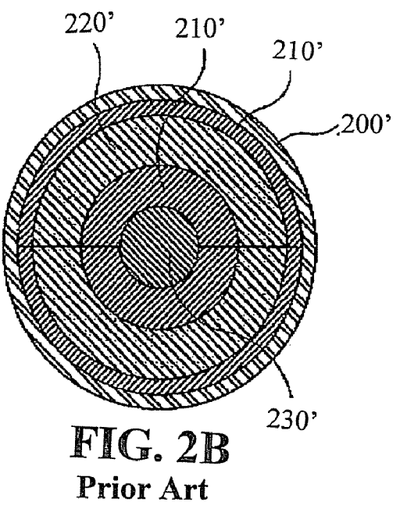

FIGS. 2A-2D illustrate embodiments of four vibration sensor designs I-IV, respectively, each of which have different sensing structures but are designed to have the same resonance frequency and weight of the proof mass for fair comparisons. The four designs of FIGS. 2A-2D have a frame 200, 200', 200", and 200''', an electrode 210, 210', 210", and 210''', a beam 220, 220', 220", and 220''', and a proof mass 230, 230', 230", and 230''', respectively. Design I of FIG. 2A and Design II of FIG. 2B are conventional sensing structure designs. Design I corresponds to sensing structure 150 and Design II corresponds to sensing structure 100. Design III and Design IV are embodiments of the present invention and are new non-conventional sensing structures.

Figure 2C:
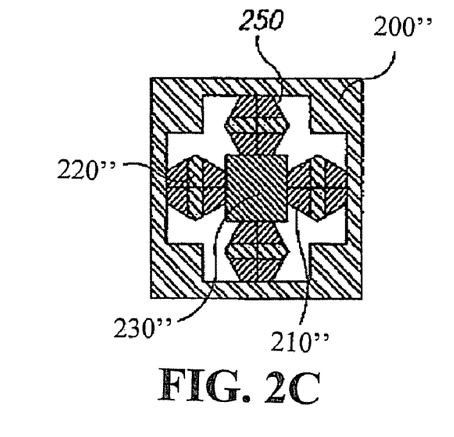

Design III is superficially similar to Design I. However, Design III has arms 250 connecting the proof mass to the frame which are thickest in the center and which taper towards the frame on one end of the arm and taper towards the proof mass on the other end of the arm. It has been found that these tapered arms offer a significant and unexpected improvement over the conventional design found in Design I.

Figure 2D:
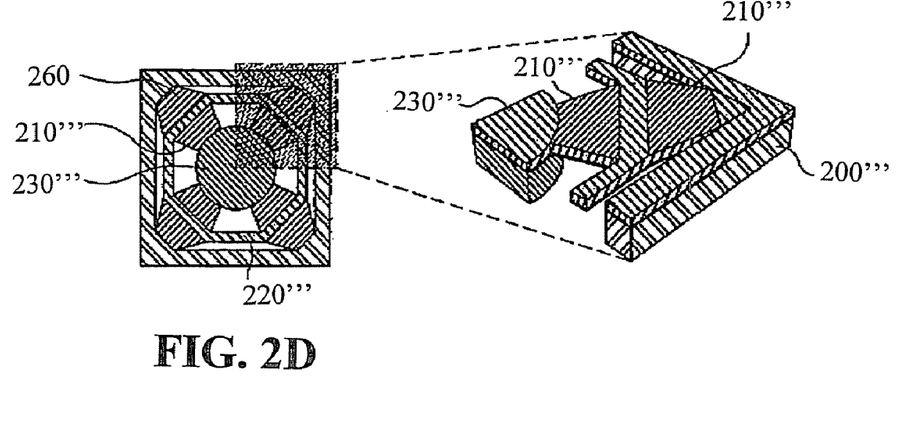

Design IV is similar to Design III except the arms 260 of Design IV are attached to the corners of the frame whereas in Design III the arms 250 are attached between the corners of the frame. Additionally, the beam in Design IV may form a ring-like structure whereas in Design III the beam portions are separated. Alternately, Design IV may be more similar to Design III and also have separated beam portions. Similar to Design III, it has been found that these tapered arms offer a significant and unexpected improvement over the conventional designs.

Figure 3:
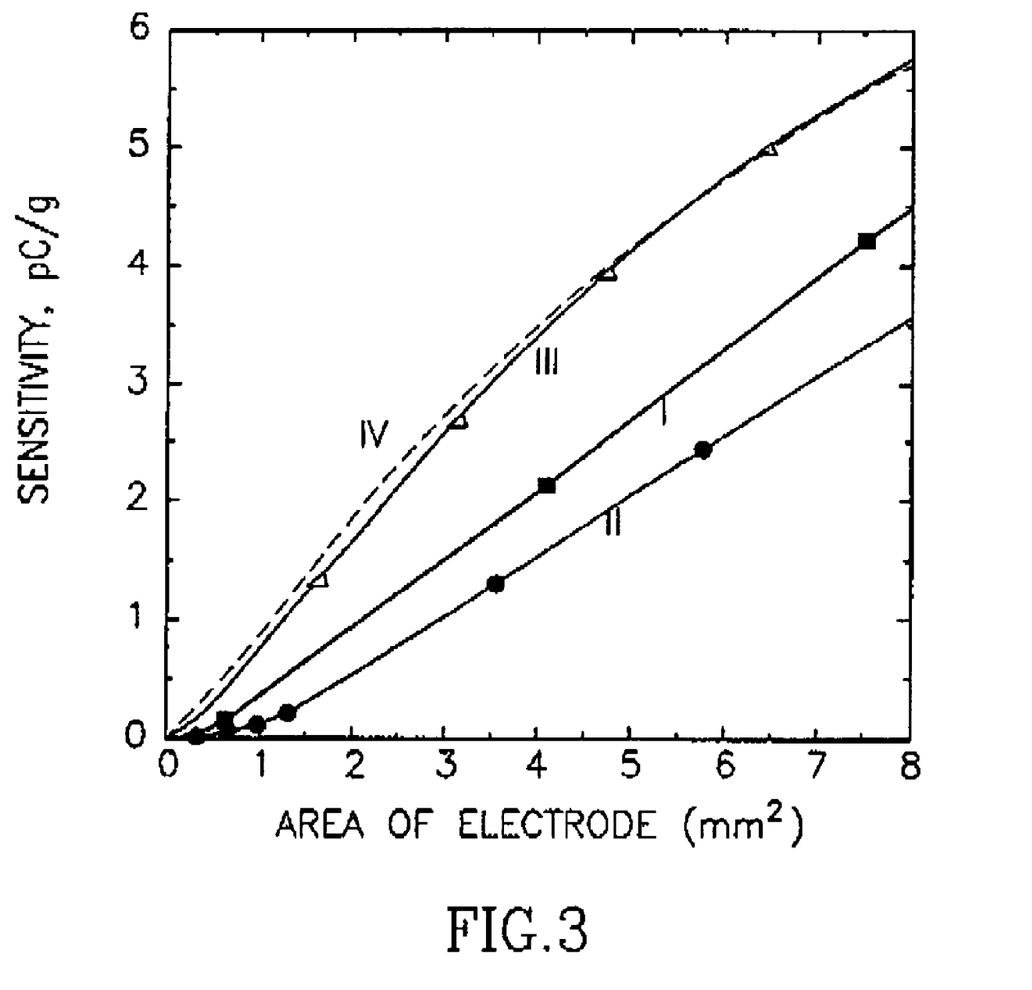
FIG. 3 shows the sensitivities of the four designs of FIG. 3, analyzed by Finite Element Analysis (FEA) simulation, which are plotted as functions of the electrode area, according to one embodiment.

FIG. 3 shows the sensitivities of embodiments of the four designs, analyzed by Finite Element Analysis (FEA) simulation, which are plotted as functions of the electrode area. Compared to Designs I and II, which have conventional beam and membrane sensing structures, Devices III and IV show significantly better sensitivities. Due to its better area utilization Device IV has the smallest size. Because in Devices III and IV the charge sensitivity ($Q_T$) to sensor capacitance ($C_s$) ratio is increased these designs also have a lower thermal-electrical noise ($a_{ne}$).

Figure 4:
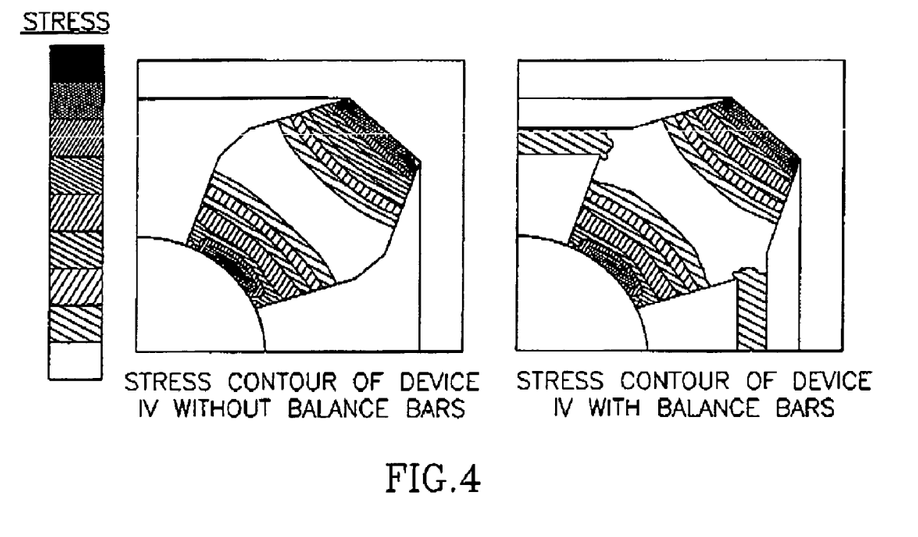
FIG. 4 shows stress contour plots of an embodiment of Device IV using four balanced bars and an embodiment of Device IV without four balanced bars, according to one embodiment.

One of the reasons for this improvement is that the tapered-beam design results in higher stress concentration on the electrode area. Furthermore, Device IV may have a ring-like beam structure. This ring-like structure may include for example four balanced bars designed to connect the four sensing beams at node positions. This makes the whole structure more reliable and stiffer in the X and Y direction (less off-axis sensitivity) without altering the resonance frequency and sensitivity. Also, as can be seen from the stress contour plots in FIG. 4, in an embodiment of Device IV using four balanced bars the stress concentration on the electrode area is increased.

The process flow for lead zirconate titanate (PZT) MEMS accelerometers is known in the art. The process flow for bulk micromachined piezoelectric Aluminum Nitride (AlN) accelerometers using Silicon on Insulator (SOI) wafers is known in the art.

Figure 10:
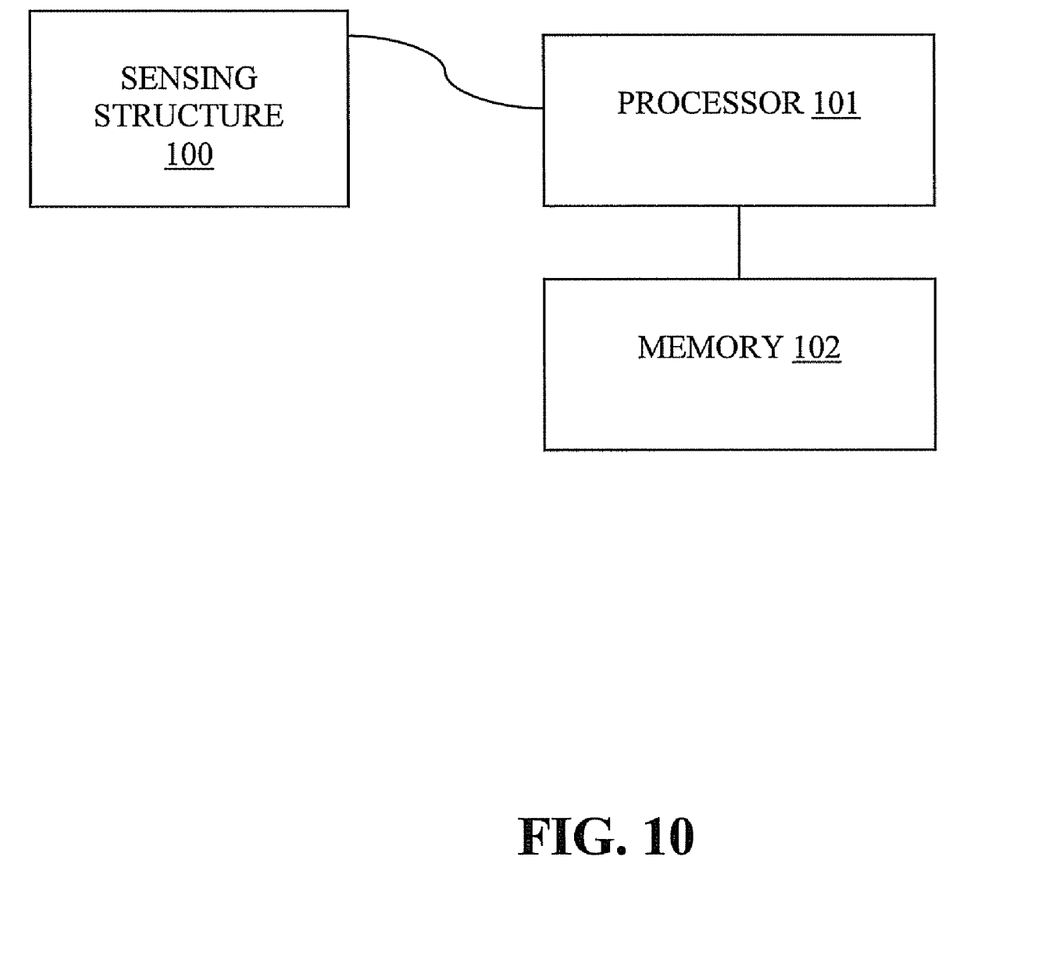
FIG. 10 shows a processor and memory.

In FIG. 10, the sensing structure 100 may be connected to a processor 101 or controller to form a sensing circuit in order to determine vibrations, stresses, and/or acceleration. The processor 101 may store output from the sensing structure and/or its determination of vibration, stress, and/or acceleration values in a memory 102. The sensing circuit may be used to monitor structures (buildings, bridges), vehicles (ships, airplanes, autos, trains) and machines.

In producing one example of an embodiment of the present invention, design IV with four balance bars was fabricated, epoxied and wire-bonded to printed circuit boards (PCB), which were designed such that the proof mass is free to move. The overall optimization of the electronic sensor readout architecture and PCB design was focused on the electrical noise floor, which is required for testing such low noise accelerometers. Thus, the differential piezoelectric sensors were connected with very short bond wires to the input charge-to-voltage converters (CVC) in order to minimize noise coupling from the environment. Proper grounding of the PCB may avoid ground loops and related 60 Hz noise issues. The differential CVC was built from a pair of ultra low-leakage current low-noise single-ended JFET amplifiers featuring an ultra low voltage noise floor and simultaneously an extremely low current noise density.

The expected sensor Brownian noise floor is around 10 ng/sqrt(Hz), which is still much lower than the detectable noise floor, limited by the interface readout electronics.

Figure 5:
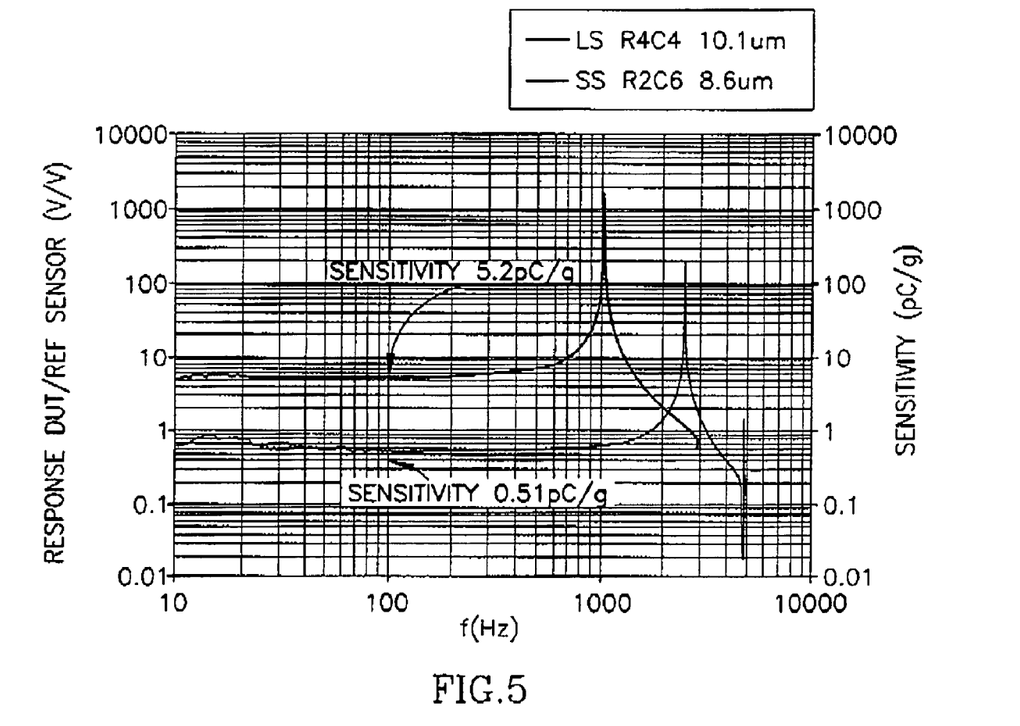
FIG. 5 shows the tested output spectra of large and medium embodiments of Device IV, according to one embodiment.
Figure 6:
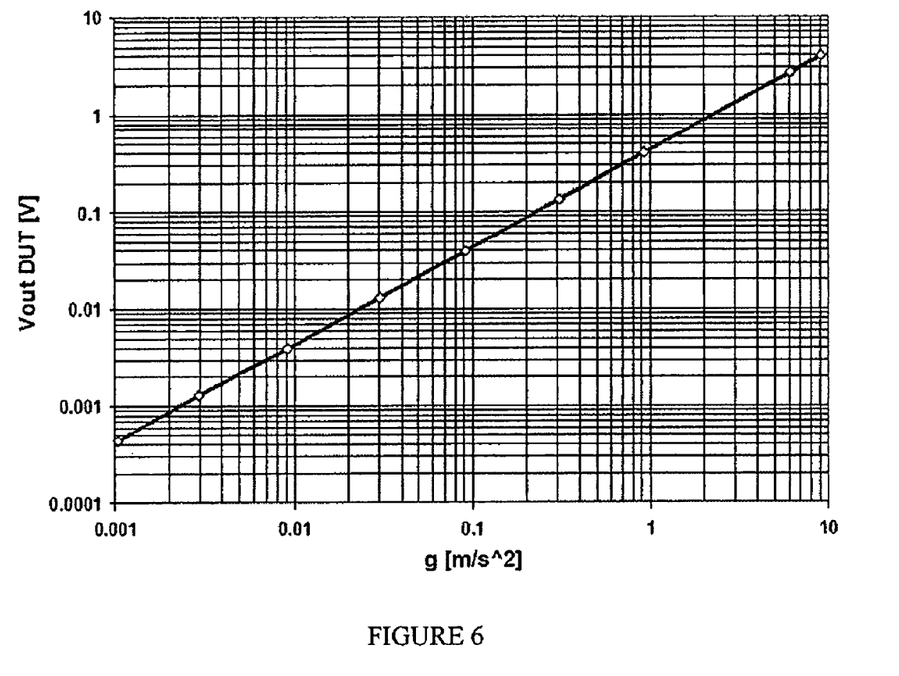
FIG. 6 shows the measured linearity from 1 mg to 10 g of the large accelerometer of FIG. 5 with maximum deviation less than 2%, according to one embodiment.

The dynamic frequency response of the accelerometers was measured using a mechanical shaker in an open-loop setup. A Dytran accelerometer with sensitivity of 0.1 V/g and wide bandwidth of 5 kHz (±2% variation, $f_0$=25 kHz) was used as a reference sensor. The tested output spectra of large and medium embodiments of Device IV are shown in FIG. 5. For the large accelerometer, the sensitivity is 5.2 pC/g and Q is 160. The measured linearity from 1 mg to 10 g of the large accelerometer is shown in FIG. 6 with maximum deviation less than 2%. The lower limit is given by the power amplifier of the shaker, while the upper level is restricted by the chosen CVC gain.

Figure 7:
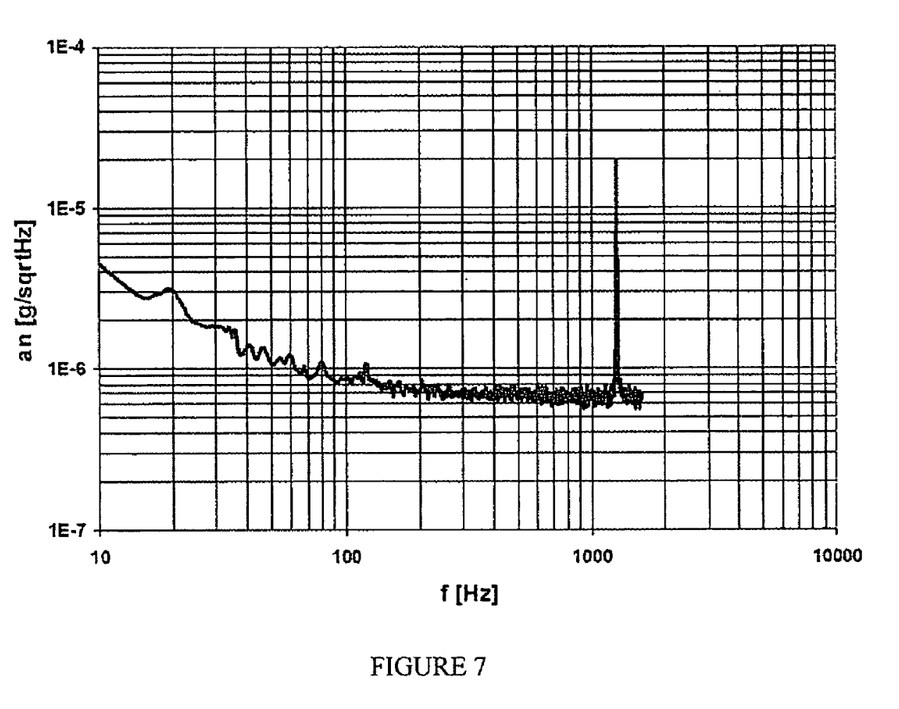
FIG. 7 shows the measured noise spectrum of the accelerometer of FIG. 6, demonstrating a total wideband sensor plus readout noise floor of 670 ng/sqrt(Hz), according to one embodiment.
Figure 8:
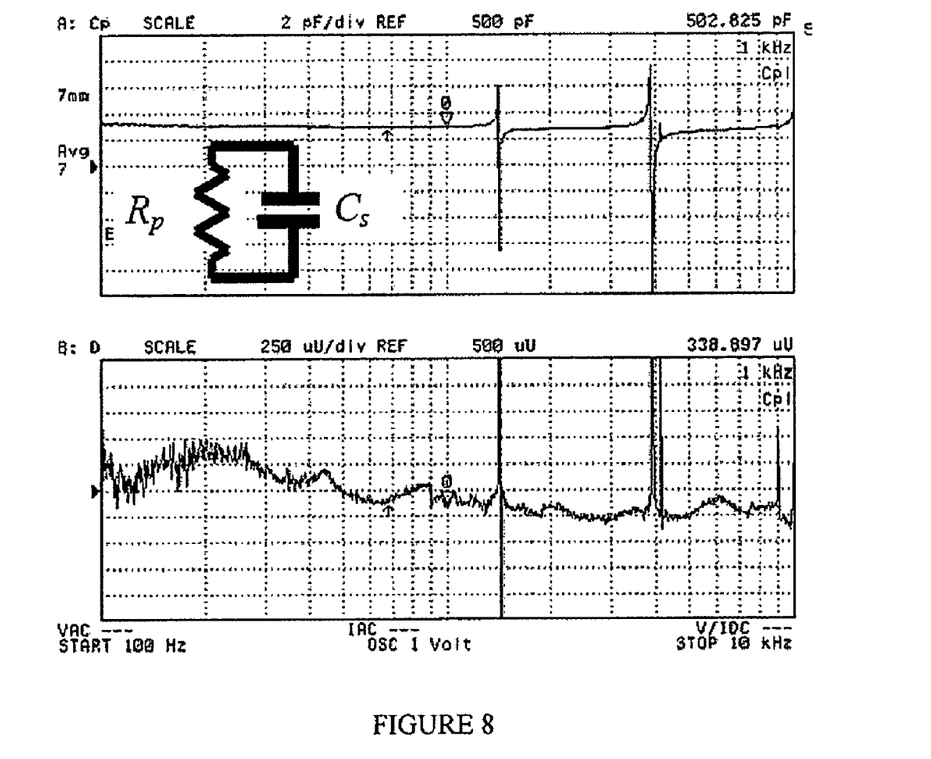
FIG. 8 shows the spread of the measured capacitance $C_s$ values and the dissipation factor $D=1/(2\pi f C_s R_p)$, according to one embodiment.
Figure 9:
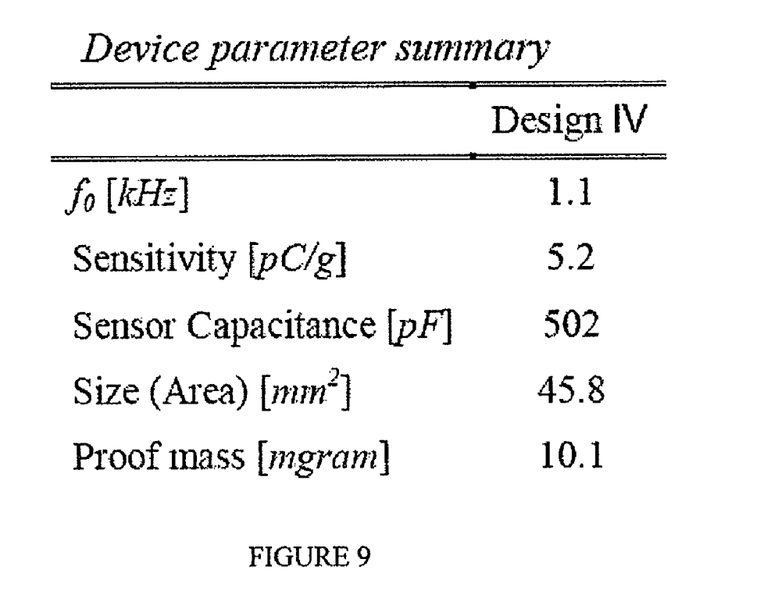
FIG. 9 shows a summary of the performance of an embodiment of the Design IV accelerometer, according to one embodiment.

The measured noise spectrum, shown in FIG. 7, demonstrates a total wideband sensor plus readout noise floor of 670 ng/sqrt(Hz). The low frequency noise (1/f noise) equals 4.2 μg/sqrt(Hz) at 10 Hz such that the noise corner frequency is below 100 Hz. The accelerometer capacitance and dissipation factors have been analyzed in a frequency range from 100 Hz-10 kHz with an Agilent 4294A impedance analyzer. The spread of the measured capacitance $C_s$ values is within 2% (3σ) and the dissipation factor $D=1/(2\pi f C_s R_p)$ is 0.071% and 0.033% at 200 Hz and 1 kHz respectively (see FIG. 8). The performance of the embodiment of the Design IV accelerometer is summarized in FIG. 9.

What is claimed is:

1. A sensing structure, comprising:
    a frame;
    a proof mass; and
    a plurality of arms, each arm comprising:
        an electrode having two ends, wherein a first of said two ends is attached to said frame and a second of said two ends is attached to said proof mass; and
    a beam disposed approximately in the center of said electrode, wherein said first end tapers from said beam to said frame and said second end tapers from said beam to said proof mass.

2. The sensing structure of claim 1, wherein said frame is a quadrilateral.

3. The sensing structure of claim 2, wherein said arms are attached to the corners of said frame.

4. The sensing structure of claim 2, wherein said arms are attached between the corners of said frame.

5. The sensing structure of claim 4, wherein said arms are attached centrally between the corners of said frame.

6. The sensing structure of claim 1, wherein said proof mass is centrally located within the sensing structure.

7. The sensing structure of claim 1, wherein said beam forms a ring structure joining said plurality of arms.

8. A sensing circuit, comprising:
    a processor;
    a sensing structure operably connected to said processor, comprising:
        a frame;
        a proof mass; and
        a plurality of arms, each arm comprising:
    an electrode wherein a first end of the electrode is attached to said frame and a second end of the electrode is attached to said proof mass; and
    a beam disposed in the center of said electrode, wherein said first end tapers from said beam to said frame and said second end tapers from said beam to said proof mass.

9. The sensing circuit of claim 8, wherein said frame is a quadrilateral.

10. The sensing circuit of claim 9, wherein said arms are attached to the corners of said frame.

11. The sensing circuit of claim 8, wherein said proof mass is centrally located within the sensing structure.

12. The sensing circuit of claim 8, wherein said beam forms a ring structure joining said plurality of arms.

13. The sensing circuit of claim 8, comprising a memory operably connected to said processor.

* * * * *